(12) United States Patent
Urry et al.

(10) Patent No.: US 6,195,029 B1
(45) Date of Patent: Feb. 27, 2001

(54) ANALOG TO DIGITAL CONVERSION SYSTEM THAT ENABLES HIGH-LEVEL SIGNAL EXCURSIONS WITHOUT CLIPPING

(75) Inventors: Robin M. Urry, Draper; Roger T. Johnsen, Salt Lake City; Richard A. Kreifeldt, Sandy, all of UT (US)

(73) Assignee: Harman Music Group, Sandy, UT (US)

( * ) Notice: Subject to any disclaimer, the term of this patent is extended or adjusted under 35 U.S.C. 154(b) by 0 days.

(21) Appl. No.: 09/160,674

(22) Filed: Sep. 25, 1998

(51) Int. Cl.$^7$ .................................................. H03M 1/62
(52) U.S. Cl. ........................... 341/138; 341/155; 381/108
(58) Field of Search .................................. 341/146, 155, 341/125, 138, 165; 342/132; 381/102, 106

(56) References Cited

U.S. PATENT DOCUMENTS

| | | | | |
|---|---|---|---|---|
| 3,828,255 | * | 8/1974 | Schuon | 341/132 |
| 4,479,250 | * | 10/1984 | Flood | 455/213 |
| 4,811,019 | * | 3/1989 | Julstrom et al. | 341/143 |
| 4,848,556 | * | 7/1989 | Shah et al. | 194/212 |
| 4,887,299 | * | 12/1989 | Cummins et al. | 381/106 |
| 4,940,977 | * | 7/1990 | Mandell | 341/143 |
| 5,222,076 | * | 6/1993 | Ng et al. | 375/223 |
| 5,786,782 | * | 7/1998 | Ostman et al. | 341/141 |
| 5,929,795 | * | 7/1999 | Wang | 341/118 |
| 5,969,652 | * | 10/1999 | Iwakiri | 341/118 |

\* cited by examiner

*Primary Examiner*—Michael Tokar
*Assistant Examiner*—Jean Bruner Jeanglaude
(74) *Attorney, Agent, or Firm*—Thorpe, North & Western, LLP

(57) ABSTRACT

A method and apparatus for combining analog and digital processing techniques to thereby capture a much wider dynamic range of an original input signal than an A/D converter can by itself, to thereby preserve a maximum amount of information from the original input signal, wherein a processing amplifier combines a level-dependent, soft logarithmic limiting function with a high-frequency pre-emphasis filter, such that the pre-emphasis helps to compensate for a disproportionate reduction of high frequency information when portions of the signal are in an overload region, and wherein digital de-emphasis of the digitized signal enables recovery of the dynamic range that was sacrificed to create the overload region.

25 Claims, 4 Drawing Sheets

ANALOG TO DIGITAL CONVERSION SYSTEM THAT ENABLES HIGH-LEVEL SIGNAL EXCURSIONS WITHOUT CLIPPING

BACKGROUND

1. The Field of the Invention

This invention relates generally to audio signal processing. More specifically, the invention relates to the combining of analog and digital processing techniques to thereby capture a much wider dynamic range of an original input signal than an A/D converter can by itself, to thereby preserve a maximum amount of information from the original input signal.

2. The State of the Art

Digital audio processing includes the conversion of analog signals to digital signals, and the subsequent recording thereof. The state of the art in digital audio processing has been driven primarily by the cleaner sound that can be achieved from digitally recorded signals. The cleaner sound is an advantage resulting from the comparatively wider linear dynamic range of digital recordings.

Those skilled in the art of standard digital audio equipment understand that a typical maximum signal-to-noise specification for 16-bit digital audio systems is in the neighborhood of 90+ dB. It is understandable why this large signal-to-noise ratio is so desirable when compared to typical signal-to-noise specifications for professional analog tape. Specifically, the signal-to-noise ratio is in the neighborhood of approximately 55 dB without the aid of noise reduction. However, applying such common noise reduction systems as dbx Type I (™), Type II (™), or Dolby (™) can achieve a signal-to-noise ratio of approximately 85 dB.

This seemingly tremendous signal-to-noise advantage of digital over analog would suggest that digital audio processing would become the unanimous and unchallenged choice for audio recording. While digital recording has substantially dominated the audio markets, the reasons extend beyond its signal-to-noise advantage. For example, digital audio recordings also provide the benefit of random access (when not recorded on tape), and the ability of the digital storage media to withstand degradation. This is in contrast to analog storage media such as tapes and LPs that can be easily wear out.

Nevertheless, despite the benefits of digital audio media, there has been a desire to return to analog equipment in the 90's. This desire is generally attributable to a unique quality and character of analog sound that is missing in digital recordings. Use of analog equipment, including relatively old vacuum tube technology, with modern digital systems has brought to light some of the previously unappreciated characteristics of analog recordings.

Those skilled in the art of recording with analog media such as tape are aware of the advantageous characteristic of being able to record high-level signals without destroying the recording. This is sometimes referred to as being able to "hit it hard." It is an unfortunate fact that the printed specifications of analog tape don't take into account the practical "headroom" available on analog media.

The maximum signal-to-noise specification of analog tape is measured by defining a "max" signal as the point at which a given signal level and frequency generate a set percentage of Total Harmonic Distortion (THD). The set percentage is typically defined as the signal level at which a 1 kHz signal produces 3% THD. However, in actual use, the signal level can easily exceed this "max" signal level by 5, 10, or even 15 dB on peaks, depending on the type of signal being recorded, and without unacceptable artifacts. Higher signal levels can be tolerated (i.e. there is more headroom) at the expense of increased THD which, incidentally, is often desirable as an effect, evidenced by the renewed popularity of vacuum tube equipment.

One conclusion is that analog recordings actually have more useable dynamic range than the technical specifications seem to indicate. For example, consider the recording of an instrument such as a kick drum. An analog tape can measure 55 dB from the 3% THD point down to the RMS (root mean square) noise floor, and the peaks of the kick drum can exceed the 3% THD level by, say, 15 dB. If this analog recording still sounds good, then there is at least 15 dB of extra and useable headroom. Accordingly, there is a total of 70 dB (55 dB plus 15 dB) of useable dynamic range. With noise reduction it is possible to easily push into the 90+ dB dynamic range territory of 16-bit digital processing. This explains why well-recorded analog master tapes make good-sounding CD's with no objectionable noise.

One main drawback of digital processing and recording is that it inherently lacks this forgiving and beneficial headroom characteristic of analog recording. Although digital conversion exhibits a wide linear dynamic range, when there is no available headroom for high-level signals, hard clipping or even ugly signal wrap-around occurs. Contributing to the bad sound produced by analog-to-digital (A/D) converter clipping is the fact that high-frequency information that is "riding" on a lower frequency waveform is completely lost for the portion of the signal which is clipped. Adding to these problems, analog-to-digital (A/D). converters exhibit their own nasty side effects such as going unstable when a modulator is overdriven by high-level signals.

Disadvantageously, these shortcomings of digital processing have drastically affected the way users operate their equipment. For example, a user who is concerned about overdriving a converter input may end up recording at lower signal levels to thereby ensure that there is ample headroom to allow for the large peaks that would ruin an otherwise perfect recording. This, of course, compromises signal-to-noise performance since the signal is now closer to the noise floor. Because users of digital equipment have to be extremely careful not to exceed 0 dB FS (full-scale) of the A/D converter, the users must use peak-reading headroom meters. In contrast, the forgiving nature of analog tape allows users of analog recording equipment the luxury of only needing to monitor an average signal level using VU meters, often having no peak indicators whatsoever.

Some audio processing equipment designers have partially addressed the problem of the unforgiving nature of analog-to-digital conversion. The designers have limited the signal being recorded by placing static limiting circuits in front of an A/D converter in order to avoid the undesirable artifacts that result from overloading.

It should be clarified that the word "static" above is used to describe a circuit that has a fixed input/output gain relationship whose gain characteristics are not dependent on a control signal. These circuits have limiting characteristics ranging from what is described as "hard", where there is a quick transition from linear to non-linear operation, to "soft", where the transition is more gradual. The more abrupt the transition, the more harsh-sounding the result. By selecting the cleaner sounding "soft" limiting, the wide linear dynamic range of digital processing is sacrificed. In contrast, selecting the harsh-sounding "hard" limiting sacrifices less of the linear dynamic range, but results in only marginal audible advantages over the clipping that otherwise occurs in the A/D converter.

Other designers or users of digital equipment have placed dynamic, as opposed to static, limiting circuits or equivalent equipment in front of the A/D converter. These dynamic circuits typically make use of a variable gain element such as a voltage-controlled amplifier (VCA), a field-effect transistor (FET), or an optically-coupled element such as a vactrol having a light-emitting diode (LED) to control the resistance of a light-dependent resistor (LDR).

These dynamic circuits or equivalent equipment have level detection circuitry which sense when the signal level exceeds a preset maximum input level that is being received at the A/D converter. In response, the level detection circuitry develops a control signal to decrease the gain through the variable gain element, thus preventing an overload condition from occurring for an extended period of time. Those skilled in the art are aware that these dynamic circuits have a finite attack time required for the detector to sense the signal level. Unfortunately, during this attack time the maximum A/D level can be exceeded, and the signal will be clipped.

To avoid this brief over-excursion into a clipping region, some designers couple static clipping circuits with dynamic limiting circuits to create "brick wall" limiting having a virtually instantaneous attack time. Those skilled in the art recognize that all these dynamic solutions add significant cost and complexity to a digital processing system. Furthermore, each has its own characteristic sound which may or may not be desirable for a particular application.

Accordingly, it would be an advantage over the state of the art to provide an analog-to-digital conversion system that could provide the benefits of the desirable audio characteristics of an analog recording, combined with the wider linear dynamic range of a digital recording.

OBJECTS AND SUMMARY OF THE INVENTION

It is an object of the present invention to provide a method and apparatus for digital processing using an analog-to-digital (A/D) conversion system that does not have an abrupt ceiling when converting a high-level signal.

It is another object of the present invention to provide an A/D conversion system that allows signal excursions above a level that would normally be clipped in an A/D converter, while never allowing the high-level signals to actually reach a full-scale input level of the A/D converter.

It is another object of the present invention to provide an A/D conversion system that avoids loss of high frequency signal information during high-level signal excursions.

It is another object of the present invention to provide an A/D conversion system that compensates for a disproportionate loss of high frequency signal information compared with low frequency signal information.

It is another object of the present invention to provide an A/D conversion system that does not compromise the inherently wide linear dynamic range of the A/D converter.

It is another object of the present invention to provide an A/D conversion system in which a difference between a start of an over-region and a noise floor level is at least the same or greater than a difference between the full-scale signal level and the noise floor level of the A/D converter by itself.

It is another object of the present invention to provide an A/D conversion system that is less expensive to implement than other systems that dynamically compensate for the abrupt ceiling for high-level signals in typical A/D converters.

It is another object of the present invention to provide a method and apparatus for digitally metering high-amplitude analog input signals, making it possible to display signal levels that are above the full-scale amplitude of the A/D converter, even though the amplitude of the signal is below full scale.

It is another object of the present invention to provide the method and apparatus for digitally metering as described above, without having to actually monitor the analog input signal.

The present invention is a method and apparatus in a preferred embodiment for combining analog and digital processing techniques to thereby capture a much wider dynamic range of an original input signal than an A/D converter can by itself, to thereby preserve a maximum amount of information from the original input signal.

In a first aspect of the invention, a processing amplifier is provided which combines a level-dependent, soft logarithmic limiting function with a high-frequency pre-emphasis filter. The pre-emphasis helps to compensate for a disproportionate reduction of high frequency information when portions of the signal are in an overload region.

In a second aspect of the invention, digital de-emphasis of the digitized signal enables recovery of the dynamic range that was sacrificed to create the overload region.

In a third aspect of the invention, the pre-emphasis filter is utilized to boost high frequency signals contained in the original input signal, and the de-emphasis filter is then used to complementarily reduce these same high frequencies.

In a fourth aspect of the invention, the A/D noise floor is reduced by approximately 4 dB to thereby enable recovery of the entire original linear dynamic range of the A/D converter.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

Before describing the presently preferred embodiment of the present invention, it is useful to briefly state the overall objective of the present invention. Specifically, what has been developed and is now described as the present invention is an A/D conversion system which advantageously combines analog and digital processing techniques to capture a much wider dynamic range than the A/D converter could capture by itself, thereby preserving the maximum amount of information from the original analog signal. This information is then encoded within the available bits of whichever A/D converter is used.

The present invention must have forgiving characteristics analogous to those inherent in analog recording in that the A/D conversion system must not have an abrupt ceiling when handling high-level signals, thus allowing high-level signal excursions without clipping the A/D converter, and doing so without completely losing high-frequency signal information. Additionally, the system must compensate for a disproportionate reduction of high-frequency signal information compared to low-frequency signal information.

Fortunately, implementation of the A/D conversion system with a processing amplifier requires only a small number of circuit components on the analog side, and thus can be quite inexpensive. On a digital side, post-A/D processing requires a digital signal processor (DSP), but in the majority of applications for the A/D conversion system, DSP processing is already available and, therefore, is essentially free if the small amount of code space is available. The extra processing power is minimal since only a simple digital de-emphasis filter is required to undo the analog pre-emphasis filter.

Figure 1:
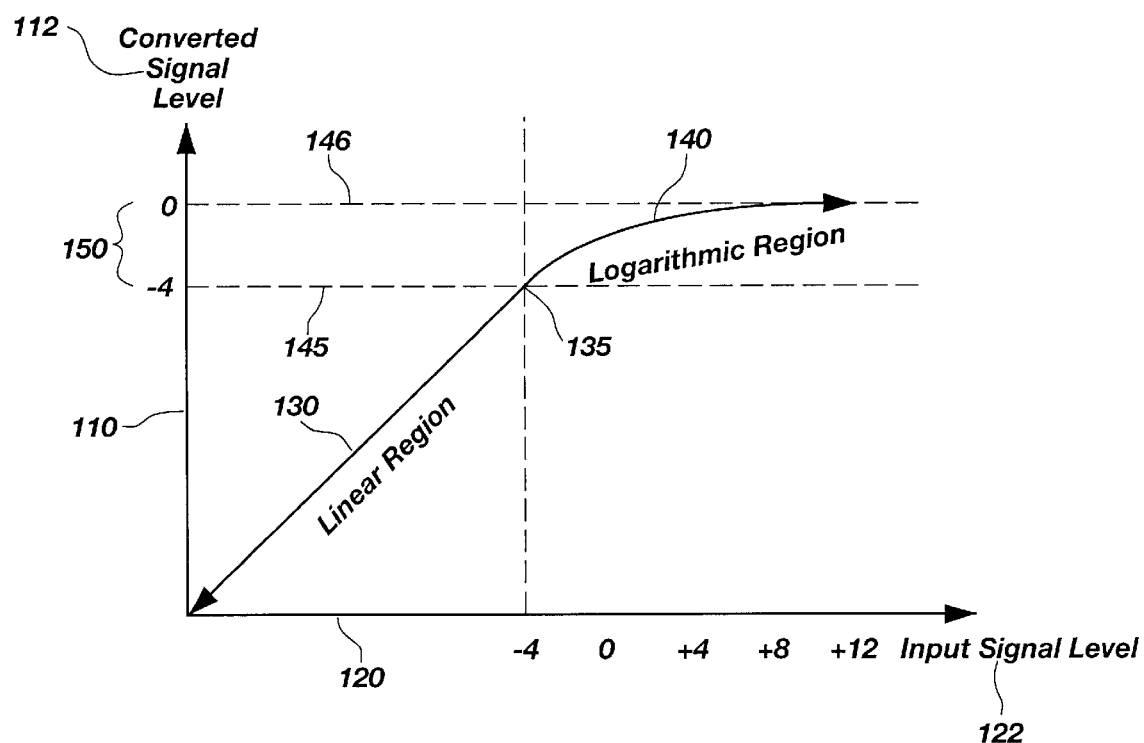
FIG. 1 is a graph representing the relationship between input signal level versus converted signal level in the A/D converter system that is constructed in accordance with the principles of the presently preferred embodiment.

FIG. 1 shows that the A/D conversion system of the present invention utilizes the top 4 dB 150 of the A/D converter's linear dynamic range to create a soft logarithmic "overload region" or "Over Region" using a novel static "soft" limiting technique. This technique enables high-level transient signals passing far above a point where the overload region begins, to be adequately represented in just 4 dB of an A/D converter's dynamic range. A typical A/D converter would clip these high-level signals. Yet, in contrast to prior A/D systems that use soft limiting techniques, by means of a novel processing scheme, none of the A/D converter's linear dynamic range was sacrificed in creating this region.

In the A/D conversion system of the presently preferred embodiment, signals above −4 dB full scale (FS) of the A/D converter are logarithmically "mapped" from the linear domain to a non-linear domain. The reasoning behind the selection of a 4 dB range is simply a matter that it represents a good compromise, allowing a soft overload region which behaves in an analogous manner to the overload characteristics of analog tape, yet not so soft that it requires too much of the A/D's linear range to create the overload region. Accordingly, in an alternative embodiment, it is acceptable to implement a version of the present invention having means to vary the size of the overload region to thereby suit a particular purpose.

Before describing FIG. 1 in greater detail, it is interesting to consider that the validity of the approach of the present invention can be called into question. This is because the presently preferred embodiment basically describes trying to represent a lot of signal information within a smaller "space". The reason why this counter-intuitively makes sense is that the digital codes in a converter are linear, or evenly-spaced. This means that each consecutive code represents the same change in voltage of the input signal. This then implies that half of the digital codes are used to represent input signals whose voltage level is below ½ of the full-scale A/D input voltage, while the other half of the codes are used to represent signals above ½ of the full-scale A/D input voltage. This assumption seems reasonable until it is recognized that ½ of the full-scale input is only 6 dB below full-scale. Accordingly, half of the codes are used to represent only the top 6 dB of signal information, while the other half are used to represent the remaining 80 to 110 dB of signal information, depending on the quality of the A/D converter. With the amplitude resolution increasing toward the top end of the A/D converter, it seems not only reasonable, but desirable, to utilize this density of digital codes to represent more dynamic range of the converted signal within this region.

To provide a more detailed description of FIG. 1, the graph specifically illustrates the concept showing the output vs. input relationship of the presently preferred A/D conversion system from the input to the system to the output of an A/D converter. The converted signal level is plotted along the vertical Y-axis 110 of the plot vs. the level of the input signal along the horizontal X-axis 120. As can be seen from this figure, the converted signal level 112 is equal to the input signal level 122 as long as the input signal level 122 is in the linear region 130 which is below the transition point 135. This transition point 135 represents the transition between the linear region 130 and the logarithmic region 140 or overload region. The logarithmic "mapping" of the overload region begins at a level 145 that is, in the presently preferred embodiment, selected to be 4 dB below 0 dB FS (full-scale) 146 of the A/D converter. Above this transition point 135, in the logarithmic region 140, high-level input signals get mapped into the top 4 dB 150 of the A/D converter.

This mapping is analogous to the signal compression effect that occurs when recording high-level signals onto analog tape. To be technically accurate, it should be noted that the curve in the logarithmic region 140 does not completely flatten out. Because it is a log function, the curve theoretically keeps increasing forever at a continually decreasing rate and would eventually go beyond 0 dB FS, but the input signal required to reach 4 dB over the transition point 135 is at a higher level than would ever need to be accommodated in a system having a reasonable amount of analog headroom. In other words, the input signal would actually clip an analog amplifier stage "upstream" from the limiter before ever clipping the A/D converter. The clipped amplifier stage would simply act as a more well-behaved hard limiter than would the A/D converter if driven into clipping.

A significant advantage of the logarithmic mapping of this novel A/D conversion system is that it preserves the high-frequency detail of the portion of the signal that is within the overload region. When a conventional A/D converter is overloaded with a typical input signal having both low-frequency and high-frequency components, a considerable and disproportionate amount of high-frequency signal information is lost compared with the amount of low-frequency information lost. During clipping, the low frequency content of the signal simply gets distorted, although it maintains most of its signal characteristics and amplitude. However, some sections of the high-frequency signal are completely lost. Using the conversion system of the present invention, its logarithmic limiting function prevents high-frequency signal information from being lost since the signal is confined within the overload region and never clips the A/D converter.

Preventing the complete loss of sections of high-frequency signal information is a natural result of using static soft limiting. However, these limiters are not completely free from having an effect on the spectral content of the signal. Similar to the situation wherein a clipped signal completely loses sections of high-frequency information, processing signals through a static soft limiter inherently de-emphasizes the high frequencies relative to low frequencies. In the high-amplitude portions of the low-frequency waveform which push into the soft limiting region, the high-frequencies riding on these portions are reduced in amplitude by the logarithmic function of the limiter. Whereas entire sections of the high-frequency waveform may be within this region during high-level peaks, only the peaks of the low-frequency waveform are inherently reduced in amplitude by the soft limiting function. Again, this represents a disproportionate reduction of the high-frequency signal amplitude compared with the low-frequency signal amplitude. For this reason, the conversion system of the present invention compensates for this spectral imbalance by including a pre-emphasis filter within the soft limiter. In contrast, prior A/D systems using soft limiting techniques do not compensate for this effect. By compensating, a novel combination of pre-emphasis and static soft limiting is implemented.

It is also important to realize that if the present invention used pre-emphasis compensation means as taught in the prior art, it would have resulted in the loss of high-frequency headroom. Advantageously, however, this problem is addressed with the conversion system of the present invention.

Figure 2:
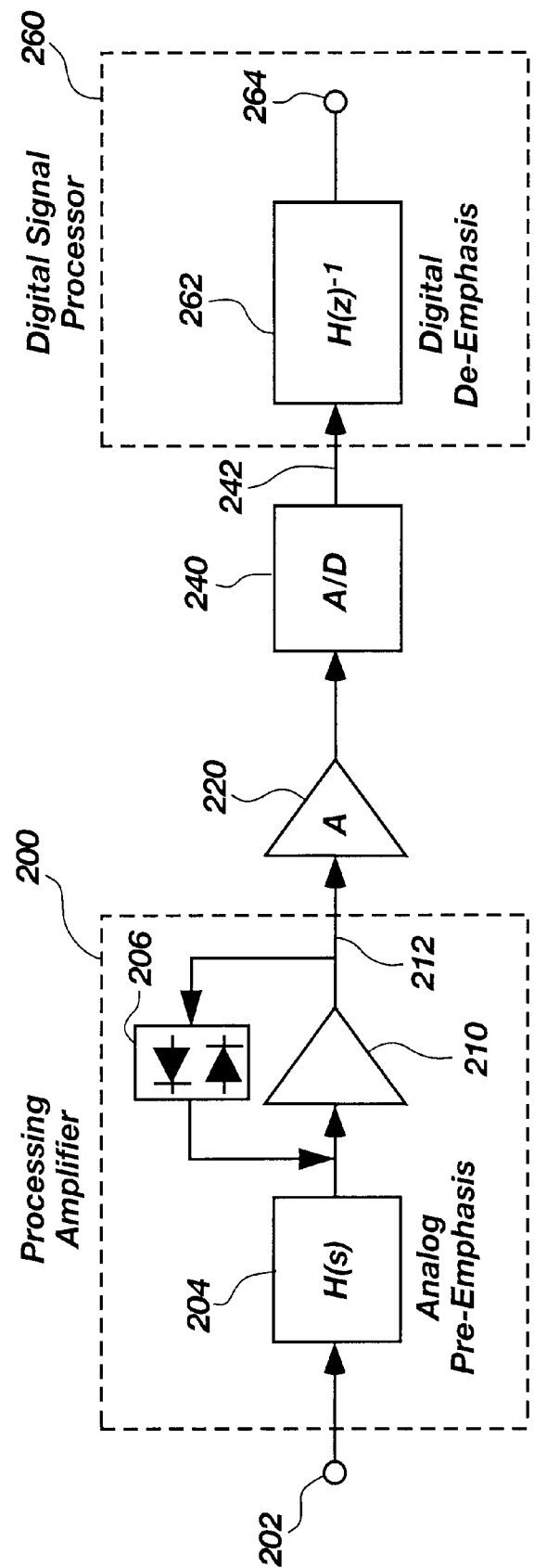
FIG. 2 is a block diagram of the A/D converter system of the presently preferred embodiment described in FIG. 1.

FIG. 2 is a block diagram of the presently preferred embodiment of the present invention having two processing blocks 200, 260 which, when added to a conventional A/D converter 240, comprise the basic elements of the present A/D conversion system. The first block 200 is an analog processing amplifier containing the logarithmic soft limiting function 206 and pre-emphasis filter 204 in conjunction with an audio amplifier 210. An analog input signal 202 is processed through the processing amplifier 200 to thereby generate a processed analog output signal 212.

Typically, this output signal 212 is routed through an additional audio amplifier stage or stages 220 having an attenuation factor "A" to thereby translate voltage levels between the processing amplifier 200 and the A/D converter 240. Also, this attenuation factor "A" enters into the equation in mapping the linear/logarithmic transition point to the −4 dB FS level of the A/D converter 240. Thus, the first 4 dB range of operation of the limiter is mapped to the top 4 dB of the A/D converter 240.

The exact explanation of and calculations for the stage or stages 220 between the processing amplifier 200 and A/D converter 240 are highly dependent on the chosen A/D converter, and those skilled in the art will fully understand the simple method involved in doing this. It is a matter of ensuring that the voltage level produced by the processing amplifier 200 at the transition point between linear and logarithmic limiter operation is translated to the voltage level which would produce a −4 dB FS level in the A/D converter 240.

An output signal 242 of the A/D converter 240 drives the digital audio input of a digital signal processor (DSP) 260. This output signal 242 is typically a data stream in I$^2$S format, which is common in the industry and well known to those skilled in the art. The DSP 260 is configured to apply digital de-emphasis 262 that is complementary to the analog pre-emphasis 204. From the output of the de-emphasis 262, the processed digital signal 264 is available for further application-specific digital signal processing (such as recording).

Figure 3:
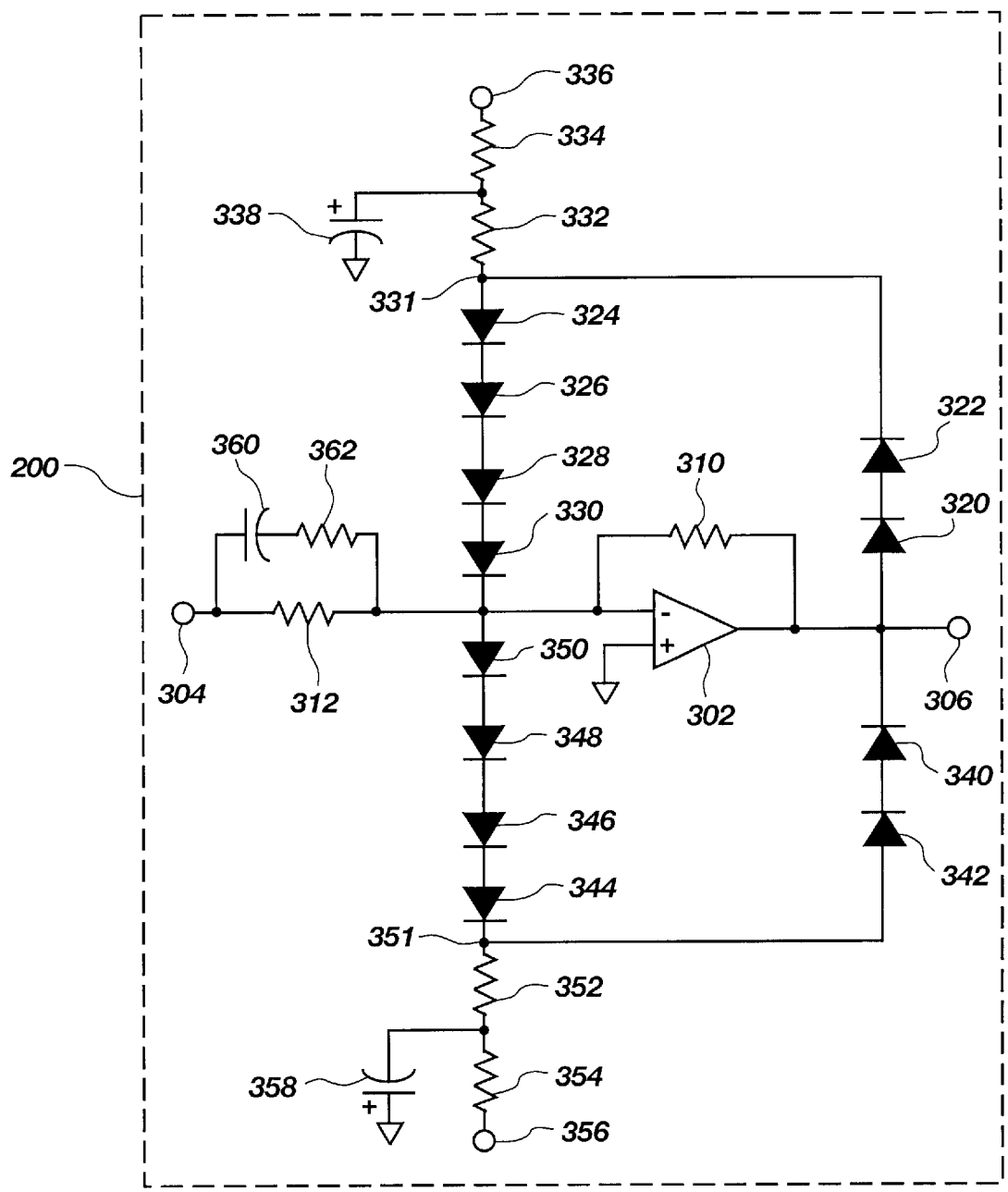
FIG. 3 is a detailed circuit schematic diagram of the processing amplifier that incorporates soft limiting and pre-emphasis features of the presently preferred embodiment.

FIG. 3 is a circuit schematic diagram of the processing amplifier 200 that is used to create the linear/logarithmic response illustrated in FIG. 1. This amplifier 200 is based on an op-amp 302 connected in an inverting configuration having unity gain at low frequencies. An analog input signal is presented to an input terminal 304 and a processed analog output signal is produced at an output terminal 306. A feedback resistor 310 is connected between the output of the op-amp 302 and its inverting input. An input resistor 312 is connected between the input terminal 304 and the op-amp 302 inverting input. The low-frequency gain of the processing amplifier 200 is given by a negative of the value of the feedback resistor 310 divided by the value of the input resistor 312. The presently preferred values for these resistors 310, 312 are 2 kΩ each which produce inverting unity gain at low frequencies.

This processing amplifier 200 also incorporates soft limiting and pre-emphasis functions. The logarithmic soft limiting function is created by placing diodes in the feedback of the op-amp 302 in parallel with the feedback resistor 310. Six series-connected 1N4148-type or similar diodes 320, 322, 324, 326, 328, 330 are placed anode-to-cathode in the feedback with the anode of the first diode 320 being connected to the output terminal 306 of the op-amp 302, the cathode of the last diode 330 being connected to the inverting input of the op-amp 302. A second string of six series-connected 1N4148 diodes 340, 342, 344, 346, 348, 350 is placed in the feedback in a reverse manner from the first string, the cathode of the first diode 340 in the second string being connected to the output terminal 306 of the op-amp 302, and the anode of the last diode 350 in the second string being connected to the inverting input of the op-amp 302.

Connected at the junction 331 between the cathode of the second diode 322 and the anode third diode 324 of the first string is a first positive bias resistor 332. In series with this first resistor 332 is a second positive bias resistor 334, one terminal of which is connected to the first resistor 332, the other terminal of which is connected to the positive power supply 336. The positive polarity side of an electrolytic filter capacitor 338 is connected from the junction between the positive pair of bias resistors 332, 334 to ground.

In a similar manner, but of opposite polarity, a pair of series-connected negative bias resistors 352, 354 is connected from the anode-cathode junction 351 between the second diode 342 and third diode 344 of the second string and the negative power supply 356. Likewise, but opposite in polarity, the negative polarity side of a second electrolytic filter capacitor 358 is connected from the junction between the negative pair of bias resistors 352, 354 to ground.

In operation, the first string of diodes 320, 322, 324, 326, 328, 330 are connected such that they will limit the positive output swing of the op-amp 302 while the second string of diodes 340, 342, 344, 346, 348, 350 will similarly limit the negative swing. For low-level signals, the last four diodes 324, 326, 328, 330 of the first string are slightly forward biased by the current through the pair of positive bias resistors 332, 334, while the first two diodes 320, 322 are reverse biased. Similarly, the last four diodes 344, 346, 348, 350 of the second string are slightly forward biased by the current through the pair of negative bias resistors 352, 354, while the first two diodes 340, 342 of the second string are reverse biased. By slightly forward biasing these diodes 324, 326, 328, 330, 344, 346, 348, 350, the logarithmic limiting function will not be active for low-level signals since the impedance of these components in the feedback of the op-amp 302 will be extremely high compared to that of the feedback resistor 310 due to the first two diodes 320, 322, 340, 342 of each string being reverse biased. This is designed in this manner to ensure that the circuit adds no distortion to low-level signals.

The bias voltages at the anode-cathode-bias junctions 331, 351 are approximately +2.4 V and −2.4 V for the positive and negative sides, respectively. As the output signal amplitude of the op-amp 302 increases sufficiently above the +/−2.4 V bias voltages to allow the first diodes 320, 322, 340, 342 in each string to become forward biased, operation of the processing amplifier 200 changes from linear to logarithmic, resulting in a gradual transition from no limiting to fairly hard limiting. The exact values of the bias resistors 332, 334, 352, 354 are not extremely critical as they are mainly chosen simply to forward-bias the last four diodes 324, 326, 328, 330, 344, 346, 348, 350 in each string, but they do have an effect on the exact transition point and range of operation of the limiter.

Presently, the preferred bias resistors 334, 354 connected to the positive 336 and negative 356 power supplies are 33 k$\Omega$ and the bias resistors 332, 352 connected to the anode-cathode-bias junctions 331, 351 are 100 k$\Omega$. The purpose of splitting the bias resistance between two resistors with a capacitor between them to ground is to form a low-pass filter to prevent power supply noise from being induced onto the audio signal as it is summed with the audio signal at the op-amp 302. These capacitors 338, 358 are presently 47 $\mu$F. The feedback resistor 310 is presently 2 k$\Omega$ and changing its value likewise affects the transition point and range of operation of the limiter as it determines how much current is fed back through it versus the diode strings. This value was chosen to adequately produce our 4 dB overload region. The value of the input resistor 312 simply followed that of the feedback resistor 310 to maintain unity gain for low-frequency, low-level signals.

The pre-emphasis function of the processing amplifier 200 is created by connecting a series capacitor 360 and resistor 362 between the input terminal 304 and the inverting input of the op-amp 302 which puts this series RC network 360, 362 in parallel with the input resistor 312. For low frequencies, the capacitor 360 is very high impedance so this network 360, 362 is effectively out of the circuit and the op-amp 302 is still at unity gain. For high frequencies, the capacitor 360 is very low impedance so the resistor 362 is effectively in parallel with the input resistor 312, thereby lowering the equivalent input resistance and thus increasing the gain of the op-amp 302. In some mid-frequency part of the curve, the gain transitions between unity gain and the gain at high frequencies at a 6 dB/octave slope.

It is this pre-emphasis that is used to compensate for the disproportionate reduction of high-frequency information when portions of the signal are in the overload region by exaggerating the amplitude of high frequencies before they are reduced by the limiting function. This also enables recovery of the dynamic range that is sacrificed to create the overload region by using complementary digital de-emphasis to reduce the noise.

This circuit configuration wherein the pre-emphasis is an integral part of the processing amplifier is unique in that, typically, those skilled in the art would place the pre-emphasis filter in a separate stage. In contrast, the presently preferred embodiment intentionally combines it with the limiter stage. This gives the distinct advantage that the high-frequency headroom of the system is not reduced. This is a problem which would exist if the stages were separate due to the pre-emphasis filtering forcing this separate pre-emphasis op-amp stage to attempt to boost high-level, high-frequency signals beyond its maximum output capability. With an integral limiting circuit, the op-amp never attempts to drive these signals to a high level because its gain is reduced by the limiter components. Advantageously, this novel circuit can be used wherever a combination of pre-emphasis and limiting are necessary.

The presently preferred values for the pre-emphasis components are 0.027 $\mu$F for the capacitor 360 and 2 k$\Omega$ for the resistor 362. Those skilled in the art will be able to calculate the pre-emphasis function which results in the following equations:

$$f_1 = 1/[2p(R_{312}+R_{362})C_{360}]$$

$$f_2 = 1/(2p\, R_{362}C_{360})$$

$$\text{HF GAIN (dB)} = 20 \log[(R_{312}+R_{362})/R_{362}]$$

In the first equation, $f_1$ is the lower breakpoint frequency where the gain starts to increase from unity. Similarly, in the second equation, $f_2$ is the upper breakpoint frequency where the gain starts to level off before reaching the maximum high-frequency gain. Between $f_1$ and $f_2$ the slope of the gain curve is 6 dB/octave. With our presently preferred values, $f_1$ is calculated to be 1.47 kHz, while $f_2$ is 2.95 kHz. The high-frequency gain is 6.02 dB. These specific values are not critical, but typically provide enough high-frequency pre-emphasis to compensate for the disproportionate reduction of high-frequency portions of the signal which are in the overload region. Also, this amount of de-emphasis, starting at around 1 kHz, typically provides sufficient reduction of the A/D converter noise to recover roughly 4 dB of measured and subjective wide-band noise.

Figure 4:
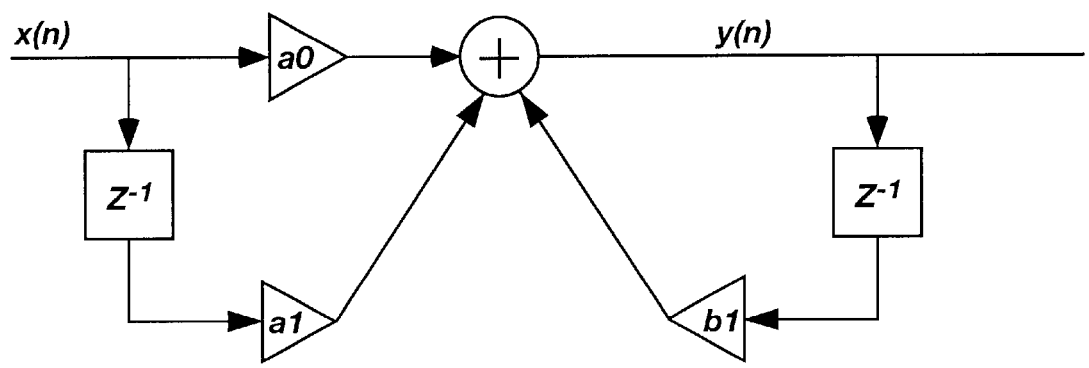
FIG. 4 is a block diagram of a circuit that shows one possible configuration of a digital de-emphasis filter that is used in the presently preferred embodiment.

FIG. 4 is a block diagram of the digital de-emphasis filter of the present invention. This filter may be implemented as any one of a number of filter types including FIR and IIR. Nevertheless, for the presently preferred embodiment, those skilled in the art will recognize FIG. 4 as the block diagram of a first-order IIR filter. This filter has one zero and one pole which will cancel the effect of the pole and zero, respectively, of the analog pre-emphasis filter. This simple digital filter is obtained by first deriving the s-domain equation for the analog pre-emphasis filter using the Laplace Transform. The component reference numbers for the resistors and the capacitor are the same as those in FIG. 3.

$$H(s) = \frac{R_{310}(1+sC_{360}(R_{312}+R_{362}))}{R_{312}(1+sC_{360}(R_{362}))}$$

This equation is then inverted:

$$H(s)^{-1} = \frac{R_{312}(1+sC_{360}R_{362})}{R_{310}(1+sC_{360}(R_{312}+R_{362}))}$$

Then using the bilinear transform, which is well-known by those skilled in the art, the following z-domain equation is obtained:

$$H(z)^{-1} = \frac{\frac{R_{312} + TC_{360}R_{312}R_{362}}{K} + \frac{R_{312} - TC_{360}R_{312}R_{362}}{K}z^{-1}}{1 + \frac{R_{310} - TC_{360}R_{310}(R_{312} + R_{362})}{K}z^{-1}}$$

where $$K = R_{310} + TC_{360}R_{310}(R_{312} + R_{362})$$

and $$T = \frac{2\pi \int}{\tan(\pi \int / FS)}$$

where T is a constant from the bilinear transform. Using the circuit values from above, the following values for the digital filter given in FIG. 4 are obtained:

$\alpha 0 = 0.5441$ $\alpha 1 = -0.3677$ $\beta 1 = 0.8236$

As should now be apparent to those skilled in the art, the extra headroom made available by the conversion system of the present invention offers an overwhelming advantage for handling and processing high-level signals. It is desirable, then, to view this extra headroom by monitoring signal levels presented to the input of this conversion system. For conventional A/D systems, it is sufficient to use the converted digital level as the meter source because these A/D systems fail to preserve any signal information outside of that represented within the linear codes of the converter. For A/D systems using soft limiting, it is useful to know the actual amplitude presented to the system for two reasons. The first reason is because that headroom is available for use. The second reason is that it may be of interest to see how far the input signal is pushing into the limiting function. Designers of previous soft limiting A/D systems desiring to monitor the analog input signal level incurred the expense of adding circuitry for this purpose. Typically, they have simply chosen to monitor only the converted digital signal. This is useful only as far as it indicates the actual amplitude of the converted digital signal. However, it does not adequately communicate to the user the amplitude of the original input signal. What is needed is a way to digitally monitor and display the analog input signal level without incurring the cost of actually reading the analog input signal.

Digital signal level information in the DSP can be used for driving digital level indicators such as bar graphs on a liquid crystal display (LCD). For typical digital conversion, it is always desirable to know how much headroom is left before reaching the full-scale amplitude of the A/D converter. In the present invention, this is hardly a concern because the logarithmic limiting function prevents the converted signal from reaching full-scale. Although the A/D conversion system by no means prevents metering being accomplished in this same way, it is far more useful to monitor the analog input signal level to see how high its peaks reach into the logarithmic region. This method of metering also enables the user to understand the advantage of the present invention by monitoring the peaks which can far exceed the amplitude level that would cause clipping in a conventional A/D converter. However, because the logarithmic limiting function always converts the amplitude of high-level signals going into the A/D so that they are below full-scale, any digital levels monitored directly from the A/D would not properly indicate the correct amplitudes for high-level analog input signals. Therefore, the presently preferred embodiment is designed to provide a transform which undoes the analog logarithmic limiting function to thereby create a signal that is used to drive digital meter segments to indicate discrete analog input signal levels. Thus, with a digital level meter, it is possible to display correct analog input levels that are above the full-scale amplitude of the A/D converter. This gives users a visual indication of how far the signal is driven into the logarithmic region. Again, this indication visually reinforces to the user the significant advantage of having the extra available headroom provided by this new conversion system.

Figure 5:
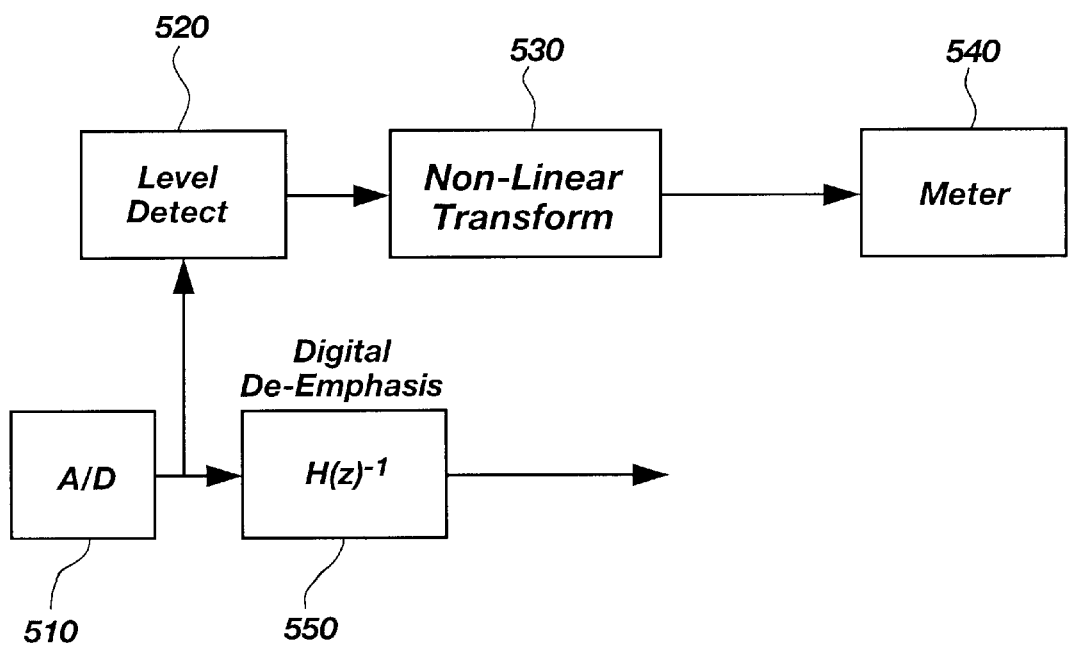
FIG. 5 is a block diagram of circuitry which includes the function of deriving the meter signal used in the presently preferred embodiment for indicating the analog input signal level.

FIG. 5 is a block diagram of the presently preferred functions which derive the meter signal used to indicate the analog input signal level. The A/D converter 510 output is sent to a level detect function 520 which samples the digital code. There are several types of useful level detector functions such as peak-hold, "leaky-peak", RMS, and average. The output of the level detector 520 is sent to a non-linear transform 530 which translates the level detector value from the non-linear domain to the domain needed by the meter 540. The meter domain could be linear, or in dB, or in some other domain useful for a particular monitoring purpose.

For example, the presently preferred method translates the digital peak signal value to the analog input signal level in dB which is how the presently preferred meter is scaled. This means that the presently preferred non-linear transform unmaps peak signals above the transition point 135 of FIG. 1 in a manner opposite to the mapping of the processing amplifier 200 of FIG. 2, and converts the unmapped signals to values in dB.

The presently preferred method for implementing the transform 530 uses a lookup table. Table values are determined empirically by measuring the output of the processing amplifier 200 with known analog input signal levels. Particular values from the peak detector 520 then correspond to particular values in the transform 530 lookup table, thus translating the proper analog input signal level to the digital meter. On a given system, it may be more desirable to implement the transform using non-linear equations to actually calculate the inverse mapping and meter domain functions. Those skilled in the art will understand the tradeoffs between computation time, memory requirements, and computational accuracy to choose the optimal implementation.

In the presently preferred method of metering, the level detector 520 monitors the signal taken directly from the output of the A/D converter 510 prior to the digital de-emphasis filter 550. This monitoring point includes the contribution of the analog pre-emphasis which helps indicate to the user how far high-frequency signals, as well as low-frequency signals, are reaching into the logarithmic region. For some users, it may be more desirable to indicate the amplitude of the analog input signal without the contribution of the analog pre-emphasis. In this case, the input to the level detector 520 would come from the output of the digital de-emphasis 550.

In summary, this combination of analog pre-emphasis and digital de-emphasis serves two purposes. First, the pre-emphasis helps to compensate for the disproportionate reduction of high-frequency information when portions of the signal are in the overload region. It does so by exaggerating the amplitude of high frequencies before they are reduced by the limiting function. Second, the technique of placing the pre-emphasis and de-emphasis "around" the A/D converter allows recovery of the dynamic range that is sacrificed to create the overload region. It does so by using the pre-emphasis to boost high frequencies contained in the audio signal prior to the A/D converter, then using the de-emphasis to complementarily reduce these same high frequencies in the audio signal after the A/D converter, including high-frequency noise. Since the noise of the A/D converter is added to the audio signal during conversion and this noise is typically dominant over the noise level of the input signal, the de-emphasis essentially reduces the high-frequency noise floor of the A/D converter. By choice, the pre-emphasis and de-emphasis filters are designed to reduce the A/D noise floor by approximately 4 dB. By recovering the 4 dB that is sacrificed, the original linear dynamic range of the converter is retained while gaining the advantage of having an overload region into which high-level signals can be mapped. Thus, the objective is fully met and the end result is a conversion system having the same linear range, yet far more headroom than a conventional A/D converter not equipped with this conversion system.

The A/D conversion system of the present invention improves the performance of any A/D converter, from low-cost 16-bit to high-performance 24-bit and beyond, and its benefits are not strictly limited to audio applications. The audible benefits of this new conversion system can easily be heard by switching it in and out while listening to signals with high-level peaks captured in the overload region. Listening to a conventional A/D converter, the harsh, "edgy" sound of the A/D converter clipping is obvious and obnoxious. With the new conversion system enabled, these undesirable artifacts disappear, thus revealing a cleaner, more open and natural sound due to the more accurate and pure representation of the original wide-dynamic range signal. Because the noise floors of the normal A/D converter and the new A/D conversion system are virtually identical sonically, there is nothing lost by creating the overload region, and the system is advantageously able to capture the true essence and fuller dynamic range of audio signals.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. An analog-to-digital (A/D) conversion system including analog and digital processing techniques to thereby digitally process an analog input signal and capture an improved dynamic range thereof, said system comprising:

an analog processing amplifier for receiving the analog input signal, wherein pre-emphasis filtering is applied, followed by logarithmic soft limiting when the analog input signal is in an overload region of operation, and wherein a first output signal is generated therefrom;

an audio amplifier for receiving and processing the first output signal to thereby attenuate the first output signal and generate a second output signal;

an analog-to-digital (A/D) converter for receiving and processing the second output signal to thereby generate a digital third output signal; and a digital signal processor (DSP) for receiving the digital third output signal, wherein the DSP digitally de-emphasizes the digital third output signal in a manner which is complementary to the analog pre-emphasis filtering to thereby generate a fourth output signal.

2. The analog-to-digital (A/D) conversion system as defined in claim 1 wherein the analog processing amplifier further comprises an operational amplifier operating with unity gain at low frequencies, wherein a feedback circuit of the operational amplifier is provided such that the logarithmic soft limiting is only active when the analog input signal is in the overload region of operation.

3. The analog-to-digital (A/D) conversion system as defined in claim 2 wherein the analog processing amplifier further comprises an analog pre-emphasis circuit which helps to compensate for a disproportionate reduction of high frequency information in the analog input signal when portions thereof are in the overload region.

4. The analog-to-digital (A/D) conversion system as defined in claim 3 wherein the feedback circuit that implements the logarithmic soft limiting further comprises:

a first resistor coupled between an output of the operational amplifier and a negative input thereof;

a first plurality of diodes coupled between the output of the operational amplifier and the inverting input thereof, in parallel with the first resistor, wherein the first plurality of diodes are connected in anode-to-cathode series, an anode of a first diode of the first plurality of diodes being coupled to the output of the operational amplifier, and a cathode of a last diode of the first plurality of diodes being coupled to the inverting input of the operational amplifier;

a second plurality of diodes coupled between the output of the operational amplifier and the inverting input thereof, in parallel with the first resistor, wherein the second plurality of diodes are connected in cathode-to-anode series, a cathode of a first diode of the second plurality of diodes being coupled to the output of the operational amplifier, and an anode of a last diode of the second plurality of diodes being coupled to the inverting input of the operational amplifier;

wherein a portion of the first plurality of diodes and a portion of the second plurality of diodes nearest the inverting input are forward biased for a low-level analog input signal to thereby deactivate the logarithmic soft limiting; and wherein a remaining portion of the first plurality of diodes and a remaining portion of the second plurality of diodes nearest the output of the operational amplifier are forward biased when the analog input signal is operating in the overload region, thereby activating the logarithmic soft limiting.

5. The analog-to-digital (A/D) conversion system as defined in claim 4 wherein the portion of the first plurality of diodes nearest the inverting input further comprises four diodes.

6. The analog-to-digital (A/D) conversion system as defined in claim 4 wherein the portion of the second plurality of diodes nearest the inverting input further comprises four diodes.

7. The analog-to-digital (A/D) conversion system as defined in claim 4 wherein the remaining portion of the first plurality of diodes nearest the output of the operational amplifier further comprises two diodes.

8. The analog-to-digital (A/D) conversion system as defined in claim 4 wherein the remaining portion of the second plurality of diodes nearest the output of the operational amplifier further comprises two diodes.

9. The analog-to-digital (A/D) conversion system as defined in claim 4 wherein a junction of the portion of the first plurality of diodes and the remaining portion of the first plurality of diodes has applied thereto a bias voltage of approximately +2.4 volts.

10. The analog-to-digital (A/D) conversion system as defined in claim 4 wherein a junction of the portion of the second plurality of diodes and the remaining portion of the second plurality of diodes has applied thereto a bias voltage of approximately −2.4 volts.

11. A method of analog-to-digital signal processing to thereby digitally process an analog input signal and improve capture of a dynamic range thereof, said method comprising the steps of:

(1) pre-emphasizing the analog input signal to thereby boost high frequency signals contained in the analog input signal;

(2) applying a logarithmic soft limiting function when the analog input signal is in an overload region of operation;

(3) attenuating the analog input signal to prepare the analog input signal for digitizing;

(4) converting the analog input signal to a digital signal in an analog-to-digital (A/D) converter; and (5) digitally de-emphasizing the digital signal in a manner which is complementary to the pre-emphasizing.

12. The method as defined in claim 11 wherein the step of applying a logarithmic soft limiting function when the analog input signal is in an overload region further comprises the step of eliminating an abrupt ceiling when the analog input signal is a high-level signal.

13. The method as defined in claim 11 wherein the step of applying a logarithmic soft limiting function when the analog input signal is in an overload region further comprises the step of enabling the logarithmic soft limiting function to exceed a signal level that would normally be clipped by an A/D converter.

14. The method as defined in claim 11 wherein the step of pre-emphasizing the analog input signal further comprises the step of compensating for a disproportionate loss of high frequency signal data compared with low frequency signal data.

15. The method as defined in claim 13 wherein the method further comprises the step of maintaining a linear dynamic range of the A/D converter.

16. The method as defined in claim 15 wherein the step of pre-emphasizing the analog input signal further comprises the step of utilizing a portion of the dynamic range of the A/D converter to create the overload region.

17. The method as defined in claim 16 wherein the step of digitally de-emphasizing the digital signal further comprises the step of recovering the portion of the dynamic range of the A/D converter that was utilized to create the overload region.

18. The method as defined in claim 17 wherein the method further comprises the step of reducing a noise floor of the A/D converter to thereby enable recovery of the dynamic range of the A/D converter.

19. The method as defined in claim 18 wherein the method further comprises the step of enabling high-level transient signals of the analog input signal to be represented in the overload region.

20. The method as defined in claim 19 wherein the method further comprises the step of enabling high-level transient signals of the analog input signal to be represented in approximately 4 dB of the dynamic range of the A/D converter, without clipping the high-level transient signals in the A/D converter.

21. The method as defined in claim 19 wherein the method further comprises the step of logarithmically mapping transient signals in the overload region of the A/D converter from a linear domain to a non-linear domain.

22. The method as defined in claim 19 wherein the method further comprises the step of selecting a range of the dynamic range of the A/D converter for use as the overload region by balancing a need for the overload region to respond in an analogous manner to overload characteristics of an analog tape, against a practical size of the overload region which borrows dynamic range from the linear range of the A/D converter.

23. The method as defined in claim 13 wherein the method further comprises the step of providing means for varying a size of the overload region to thereby adapt the system for a particular application.

24. The method as defined in claim 11 wherein the step of attenuating the analog input signal to prepare it for digitizing further comprises the step of translating voltages levels between a processing amplifier which accomplishes the functions of steps (1) and (2), and the A/D converter.

25. An analog processing amplifying system for conditioning an analog input signal to thereby compensate for a disproportionate reduction of high frequency information when portions of the analog input signal are in an overload region of operation, said analog processing amplifier comprising:

an analog pre-emphasis filter for receiving and conditioning the analog signal when the analog signal passes into the overload region of operation, and for generating an output signal therefrom;

an audio amplifier for receiving the first output signal and generating an amplified output signal; and a logarithmic soft limiting function device for receiving the amplified output signal, wherein the logarithmic soft limiting function device is not active for a low-level analog input signal, and wherein the logarithmic soft limiting function device becomes active and will transition from a condition of no limiting to hard limiting on a logarithmic scale when the analog signal passes into the overload region of operation.

* * * * *